US012604649B2

(12) United States Patent
Yan et al.

(10) Patent No.: US 12,604,649 B2
(45) Date of Patent: Apr. 14, 2026

(54) DISPLAY PANEL HAVING ISOLATION LAYER WITH DIFFERENT THICKNESSES

(71) Applicant: KunShan Go-Visionox Opto-Electronics Co., Ltd, Kunshan (CN)

(72) Inventors: Zhimin Yan, Kunshan (CN); Zhihui Xiao, Kunshan (CN); Shupeng Wang, Kunshan (CN); Huihui Meng, Kunshan (CN)

(73) Assignee: KunShan Go-Visionox Opto-Electronics Co.. Ltd, Kunshan (CN)

( * ) Notice: Subject to any disclaimer, the term of this patent is extended or adjusted under 35 U.S.C. 154(b) by 823 days.

(21) Appl. No.: 17/853,084

(22) Filed: Jun. 29, 2022

(65) Prior Publication Data

US 2022/0328792 A1     Oct. 13, 2022

Related U.S. Application Data

(63) Continuation of application No. PCT/CN2021/095392, filed on May 24, 2021.

(30) Foreign Application Priority Data

Jul. 3, 2020    (CN) ......................... 202010637479.5

(51) Int. Cl.
*H10K 71/00* (2023.01)
*H10K 59/122* (2023.01)
*H10K 59/80* (2023.01)
(52) U.S. Cl.
CPC .......... *H10K 71/00* (2023.02); *H10K 59/122* (2023.02); *H10K 59/8731* (2023.02); *H10K 59/874* (2023.02)

(58) Field of Classification Search
CPC ............. H10K 50/844; H10K 50/8445; H10K 50/846; H10K 59/122; H10K 59/873;
(Continued)

(56) References Cited

U.S. PATENT DOCUMENTS

2002/0160127 A1* 10/2002 Sakata ................... B32B 27/18
428/1.6
2004/0048033 A1     3/2004 Klausmann et al.
(Continued)

FOREIGN PATENT DOCUMENTS

CN          103222340 A     7/2013
CN          103474439 A     12/2013
(Continued)

OTHER PUBLICATIONS

International Search Report mailed Aug. 27, 2021, in corresponding International Application No. PCT/CN2021/095392, 5 pages (with English Translation).
(Continued)

*Primary Examiner* — Yara B Green
*Assistant Examiner* — Christopher M Roland
(74) *Attorney, Agent, or Firm* — Maier & Maier, PLLC

(57) ABSTRACT

Provided is a display panel. The display panel includes a substrate; multiple light-emitting structures disposed on the substrate; an obstruction layer disposed on the substrate and surrounding the multiple light-emitting structures; an isolation layer disposed on the substrate and covering the multiple light-emitting structures, where at least part of the isolation layer covers the obstruction layer; and an encapsulation layer disposed on the substrate and covering the isolation layer and the obstruction layer. A manufacturing method for the display panel includes forming the obstruction layer surrounding the multiple light-emitting structures on the substrate and forming the isolation layer covering the
(Continued)

multiple light-emitting structures and partially covering the obstruction layer.

19 Claims, 5 Drawing Sheets

(58) Field of Classification Search
CPC .. H10K 59/8731; H10K 59/874; H10K 71/00;
H10K 2102/351
See application file for complete search history.

(56) References Cited

U.S. PATENT DOCUMENTS

| | | | | | |
|---|---|---|---|---|---|
| 2006/0163989 | A1* | 7/2006 | Kawaguchi | ............. | H05K 3/02 |
| | | | | | 428/917 |
| 2009/0200930 | A1* | 8/2009 | Hayashi | ............... | H10K 59/131 |
| | | | | | 313/504 |
| 2015/0380685 | A1* | 12/2015 | Lee | ..................... | H10K 59/122 |
| | | | | | 257/40 |
| 2018/0033830 | A1* | 2/2018 | Kim | ..................... | G06F 3/0412 |

| | | | | | |
|---|---|---|---|---|---|
| 2018/0151838 | A1* | 5/2018 | Park | ..................... | G06F 3/0412 |
| 2020/0006697 | A1* | 1/2020 | Jung | ................. | H10K 59/8731 |
| 2021/0384471 | A1* | 12/2021 | Luo | ........................ | H10K 71/40 |

FOREIGN PATENT DOCUMENTS

| | | | |
|---|---|---|---|
| CN | 109755280 | A | 5/2019 |
| CN | 109904345 | A | 6/2019 |
| CN | 110010796 | A | 7/2019 |
| CN | 110061146 | A | 7/2019 |
| CN | 110473982 | A | 11/2019 |
| CN | 110993818 | A | 4/2020 |
| CN | 111785847 | A | 10/2020 |
| IN | 108400252 | A | 8/2018 |
| KR | 10-2014-0064349 | A | 5/2014 |

OTHER PUBLICATIONS

First Office Action issued Dec. 29, 2021, corresponding to Chinese Application No. 202010637479.5; 13 pages, (with machine-generated English Translation).

* cited by examiner

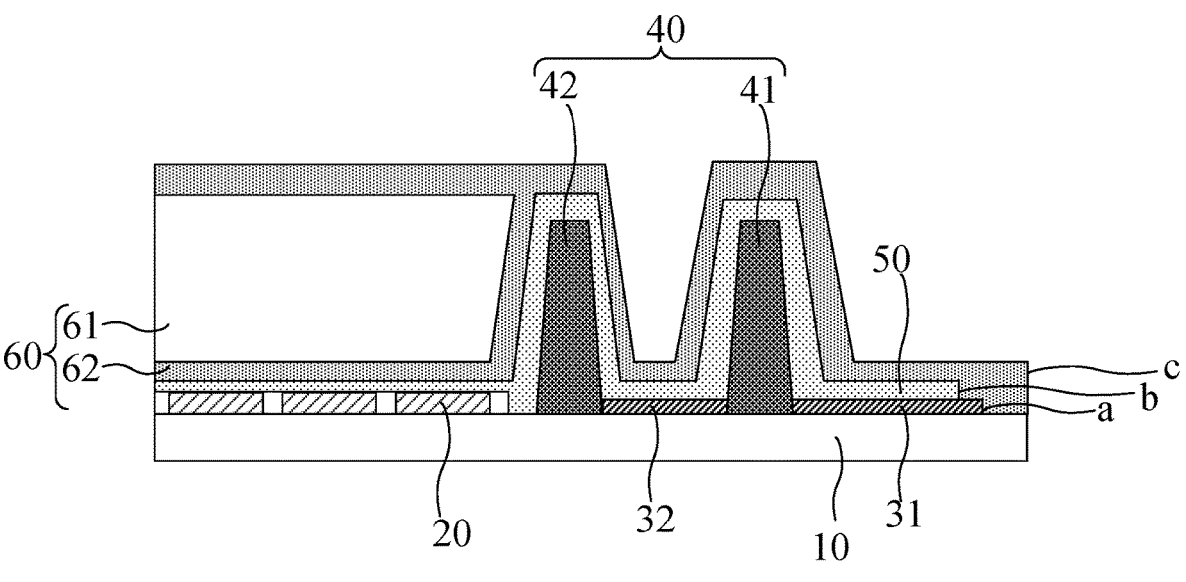

FIG. 6

| | |
|---|---|
| S10 | Provide a substrate, dispose multiple light-emitting structures on the substrate, and dispose a metal-oxide layer around the multiple light-emitting structures |
| S20 | Introduce a reducing gas to form an isolation layer such that the isolation layer covers the multiple light-emitting structures |
| S30 | Form a water and oxygen blocking layer by a reduction reaction between the metal-oxide layer and the reducing gas used in the process of forming the isolation layer such that the isolation layer at least partially covers the water and oxygen blocking layer and such that the thickness of the part of the isolation layer covering the water and oxygen blocking layer is less than the remaining part of the thickness of the isolation layer not covering the water and oxygen blocking layer |
| S40 | Form an encapsulation layer such that the encapsulation layer covers the isolation layer and the water and oxygen blocking layer |

FIG. 7

DISPLAY PANEL HAVING ISOLATION LAYER WITH DIFFERENT THICKNESSES

CROSS-REFERENCE TO RELATED APPLICATIONS

This application is a continuation of International Patent Application No. PCT/CN2021/095392, filed on May 24, 2021, which claims priority to Chinese Patent Application No. 202010637479.5 filed on Jul. 3, 2020, the disclosures of both of which are incorporated herein by reference in their entireties.

TECHNICAL FIELD

The present application relates to display technologies and, for example, a display panel and a manufacturing method therefor.

BACKGROUND

An organic light-emitting diode (OLED) display panel is a self-luminous display panel. Compared with a liquid crystal display (LCD) panel, an OLED display panel does not require a backlight, so the OLED display panel is lighter and thinner. Additionally, an OLED display panel is increasingly being applied in various high-performance display fields due to the following advantages: high brightness, low power consumption, a wide viewing angle, a high response speed and a wide operating temperature range.

However, organic light-emitting material in an OLED display panel is prone to erosion by vapor and oxygen in the outside environment, resulting in a reliability failure in the display panel.

SUMMARY

The present application provides a display panel and a manufacturing method therefor to improve the reliability of the display panel.

A display panel is provided. The display panel includes a substrate; a plurality of light-emitting structures disposed on the substrate; an obstruction layer disposed on the substrate and configured to prevent oxygen and vapor entering the display panel, the obstruction layer being surrounding the plurality of light-emitting structures; an isolation layer disposed on the substrate and covering the plurality of light-emitting structures, where at least part of the isolation layer covers the obstruction layer; and an encapsulation layer disposed on the substrate and covering the isolation layer and the obstruction layer. The obstruction layer is formed by a reduction reaction between a metal-oxide layer and gas used in the process of forming the isolation layer. A thickness of a part of the isolation layer covering the obstruction layer is less than a thickness of the other part of the isolation layer without covering the obstruction layer.

A manufacturing method for the display panel is further provided. The manufacturing method includes providing a substrate, disposing the plurality of light-emitting structures on the substrate and disposing a metal-oxide layer around the plurality of light-emitting structures; introducing gas to form an isolation layer such that the isolation layer covers the plurality of light-emitting structures; forming an obstruction layer by a reduction reaction between the metal-oxide layer and the gas used in the process of forming the isolation layer, where at least part of the isolation layer covers the obstruction layer, and a thickness of a part of the isolation layer covering the obstruction layer is less than a thickness of the other part of the isolation layer without covering the obstruction layer; and forming an encapsulation layer such that the encapsulation layer covers the isolation layer and the obstruction layer.

In the present application, the obstruction layer is configured to surround the plurality of light-emitting structures and configured to be formed by the reduction reaction between the metal-oxide layer and the gas used in the process of forming the isolation layer. In this manner, the thickness of the isolation layer covering the obstruction layer is reduced, the invasion of most vapor and oxygen is prevented, the plurality of light-emitting structures are protected, the reliability of the display panel is improved, the isolation layer having a smaller thickness is formed without using a costly production device, the manufacturing process is simple, and the production cost is saved. Moreover, when the isolation layer is completely formed, the metal-oxide layer is completely or partially reduced to metal by the gas, that is, the obstruction layer is formed. Then, the metal in the obstruction layer reacts with vapor and oxygen that invade the display panel to form a metal oxide that exists in the state of a dense metal-oxide thin film. During the use process of the display panel, the metal-oxide thin film can also prevent vapor and oxygen from invading, further protecting the plurality of light-emitting structures and improving the reliability of the display panel.

BRIEF DESCRIPTION OF DRAWINGS

FIG. 6 is another section view of the display panel of FIG. 3 along section line CC'.

FIG. 7 is a flowchart of a manufacturing method for a display panel according to an embodiment of the present application.

DETAILED DESCRIPTION

Figure 1:
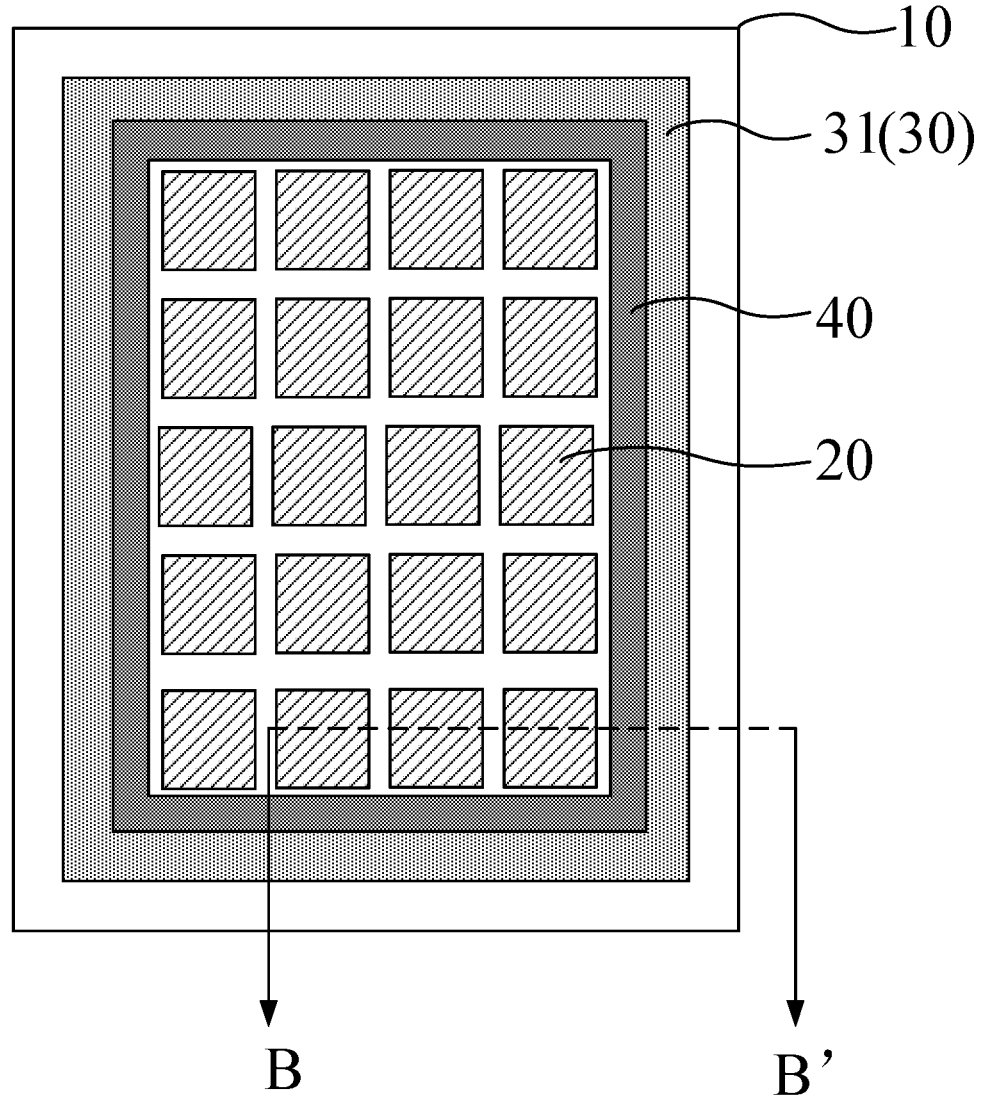
FIG. 1 is a diagram illustrating the structure of a display panel according to an embodiment of the present application.

The present application is described below in conjunction with drawings and embodiments. The embodiments described herein are merely intended to explain and not to limit the present application. For ease of description, only part, not all, of structures related to the present application are illustrated in the drawings.

Water and oxygen in the environment easily erode the organic light-emitting material in a display device. Generally, the display device includes a thin-film encapsulation layer to prevent vapor and oxygen from invading the organic light-emitting material. The thin-film encapsulation layer includes an organic layer and an inorganic layer that are stacked in a staggered way. The inorganic layer includes silicon oxynitride or silicon nitride. Since the process of forming the thin-film encapsulation layer may cause certain damage to the multiple light-emitting structures, affecting image display of the display device, before the encapsulation layer is formed, an isolation layer is firstly formed to prevent an organic light emission layer from being damaged. However, the compactness of the disposed isolation layer is always lower than the compactness of the thin-film encapsulation layer so that vapor and oxygen at the edge of the display panel may invade the interior of the display panel via the isolation layer, resulting in a reliability failure in the display panel from the edge to the inside.

Figure 2:
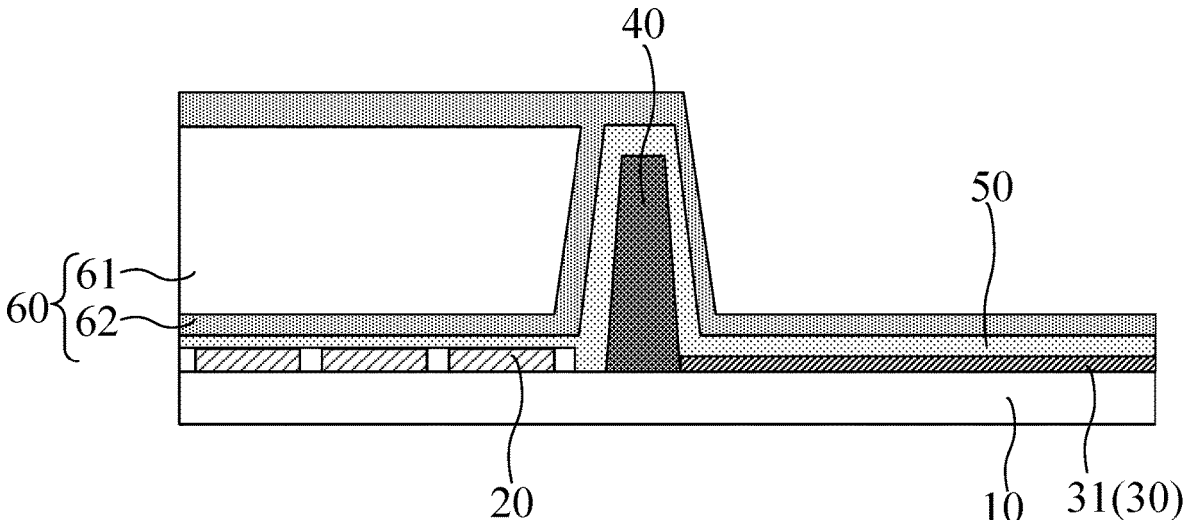
FIG. 2 is a section view of the display panel of FIG. 1 along section line BB'.

Referring to FIGS. 1 and 2, the display panel includes a substrate 10; multiple light-emitting structures 20 disposed on the substrate 10; and an obstruction layer 30 disposed on the substrate 10 and configured to prevent oxygen and vapor entering the display panel. The obstruction layer 30 surrounds the multiple light-emitting structures 20. An isolation layer 50 and an encapsulation layer 60 that are disposed on the substrate 10 are further included. The isolation layer 50 covers the multiple light-emitting structures 20 and at least partially covers the obstruction layer 30. The encapsulation layer 60 covers the isolation layer 50 and the obstruction layer 30. The obstruction layer 30 is formed by a reduction reaction between a metal-oxide layer and a reducing gas used in the process of forming the isolation layer 50. A thickness of a part of the isolation layer 50 covering the obstruction layer 30 is less than a thickness of the other part of the isolation layer 50 without covering the obstruction layer.

The substrate 10 is an array substrate for driving the light-emitting structures 20 to emit light. The substrate 10 includes a display region and a non-display region. The display region is configured for image display of the display panel. The region corresponding to the non-display region is configured off image display. The substrate 20 may include a substrate base, a buffer layer and a plurality of thin-film transistors (TFTs).

The light-emitting structures 20 are formed on the TFTs. The light-emitting structures 20 and the TFTs are both located in the display region of the substrate 10. A light-emitting structure 20 generally includes a first electrode, a light emission layer and a second electrode. The first electrode and the second electrode are insulated from each other via the light emission layer. The first electrode (anode) is electrically connected to (or integrated into) the source electrode of the TFT or the drain electrode of the TFT via a contact hole. If a voltage is applied between the first electrode and the second electrode, then the light emission layer emits visible light so that an image that can be recognized by a user is implemented.

The encapsulation layer 60 may include an organic layer 61 and an inorganic layer 62. The inorganic layer 62 may include silicon oxynitride or silicon nitride. The encapsulation layer 60 is configured to protect the light-emitting structures 20 and other thin layers in the display panel from being affected by moisture and oxygen. The isolation layer 50 is configured to protect the light-emitting structures 20 from being affected by the process of forming the encapsulation layer 60. Exemplarily, the isolation layer 50 may use silicon oxide.

The obstruction layer 30 is located in the non-display region of the substrate 10 and surrounds the multiple light-emitting structures 20. The obstruction layer 30 includes metal that reacts with vapor and oxygen that invade the display panel to form metal oxide. The formed metal oxide exists in the state of a dense metal-oxide thin film. During the use process of the display panel, the metal-oxide thin film can prevent vapor and oxygen from invading, protect the light-emitting structures 20 and improve the reliability of the display panel.

Additionally, a metal-oxide layer may be formed before the isolation layer 50 begins to form. During the process of forming the isolation layer 50, the metal-oxide layer undergoes a reduction reaction with the reducing gas used for forming the isolation layer 50. The metal-oxide layer is partially or completely reduced to metal, that is, the obstruction layer 30 is formed. When the metal-oxide layer is completely reduced to metal, the obstruction layer 30 only includes the metal. When the metal-oxide layer is partially reduced to metal, the obstruction layer 30 includes metal and metal oxide corresponding to the metal. Exemplarily, hydrogen is often used in the process of forming silicon oxide by use of the chemical vapor deposition process, and the metal-oxide layer may undergo a reduction reaction with the hydrogen used in the process of forming silicon oxide.

Since the metal-oxide layer may react with the reducing gas used in the process of forming the isolation layer 50, the formation rate of the isolation layer 50 of the surface of the metal-oxide layer is reduced. In the end, a thickness of a part of the isolation layer 50 covering the obstruction layer 30 is less than a thickness of the other part of the isolation layer 50 without covering the obstruction layer 30. Since the diffusion rate of vapor and oxygen in the isolation layer having a smaller thickness is significantly lower than the diffusion rate of vapor and oxygen in the isolation layer having a larger thickness, the reduction in the thickness of the isolation layer 50 greatly prevents most vapor and oxygen from invading, protects the light-emitting structures 20, solves the problem of the organic light-emitting material easily invaded by vapor and oxygen due to lower compactness of the isolation layers relative to the compactness of the thin-film encapsulation layer and ensures the reliability of the display panel.

In this embodiment, the obstruction layer 30 is configured to surround the light-emitting structures 20 and is formed by the reduction reaction between the metal-oxide layer and the reducing gas used in the process of forming the isolation layer 50. In this manner, the thickness of the isolation layer 50 covering the obstruction layer 30 is reduced, the invasion of most vapor and oxygen is prevented, the light-emitting structures 20 are protected, the reliability of the display panel is improved, the isolation layer 50 having a smaller thickness is formed without using a costly production device, the manufacturing process is simple, and the production cost is saved. Moreover, when the isolation layer 50 is completely formed, the metal-oxide layer is completely or partially reduced to the metal by the reducing gas, that is, the obstruction layer 30 is formed, and the metal in the obstruction layer 30 reacts with vapor and oxygen that invade the display panel to form the metal oxide that exists in the state of the dense metal-oxide thin film. During the use process of the display panel, the metal-oxide thin film can also continue to prevent vapor and oxygen from invading, further protect the multiple light-emitting structures 20 and improve the reliability of the display panel.

In this embodiment, the thickness of the silicon-oxide layer covering the surface of the obstruction layer 30 may be reduced to less than 10 nanometers, for example, less than 8 nm, less than 7 nm or less than 5 nm.

In an embodiment, referring to FIGS. 1 and 2, the display panel further includes a barricade 40 disposed on the substrate 10. The barricade 40 surrounds the multiple light-emitting structures 20. The obstruction layer 30 includes a first obstruction layer 31 disposed on a side of the barricade 40 away from the light-emitting structures 20.

The barricade 40 is generally formed by a pixel defining layer, a planarization layer and a support column which are arranged in stack. The barricade 40 may serve as a cutoff layer of the organic layer 61 in the encapsulation layer 60 and may be covered by the inorganic layer 62 in the encapsulation layer 60. Moreover, the barricade 40 can further improve the effect of blocking off vapor and oxygen by the display panel and prevent cracks of the inorganic layer 62 from transmission and expansion.

The thickness of the isolation layer 50 can be reduced by the obstruction layer 30 disposed at any position in the path from the edge of the substrate 10 to the light-emitting structures 20 so that vapor and oxygen can be prevented from invading the multiple light-emitting structures 20. Considering that the distance between the barricade 40 and a light-emitting structure 20 is very small, if the obstruction layer 30 is disposed on a side of the barricade 40 facing the light-emitting structure 20, the overall effect of preventing vapor and oxygen from invading from the edge of the display panel is not noticeable, and multiple kinds of metal wires of the display panel may be affected. Therefore, with the arrangement in which the first obstruction layer 31 is disposed on the side of the barricade 40 away from the multiple light-emitting structures 20, the width of the obstruction layer 30 parallel to the substrate 10 can be made large enough, enabling a reduced thickness of the isolation layer 50 having a larger area and ensuring the effect of blocking off vapor and oxygen. Moreover, with this arrangement, the obstruction layer 30 can be prevented from affecting the multiple kinds of metal wires in the display panel.

Figure 3:
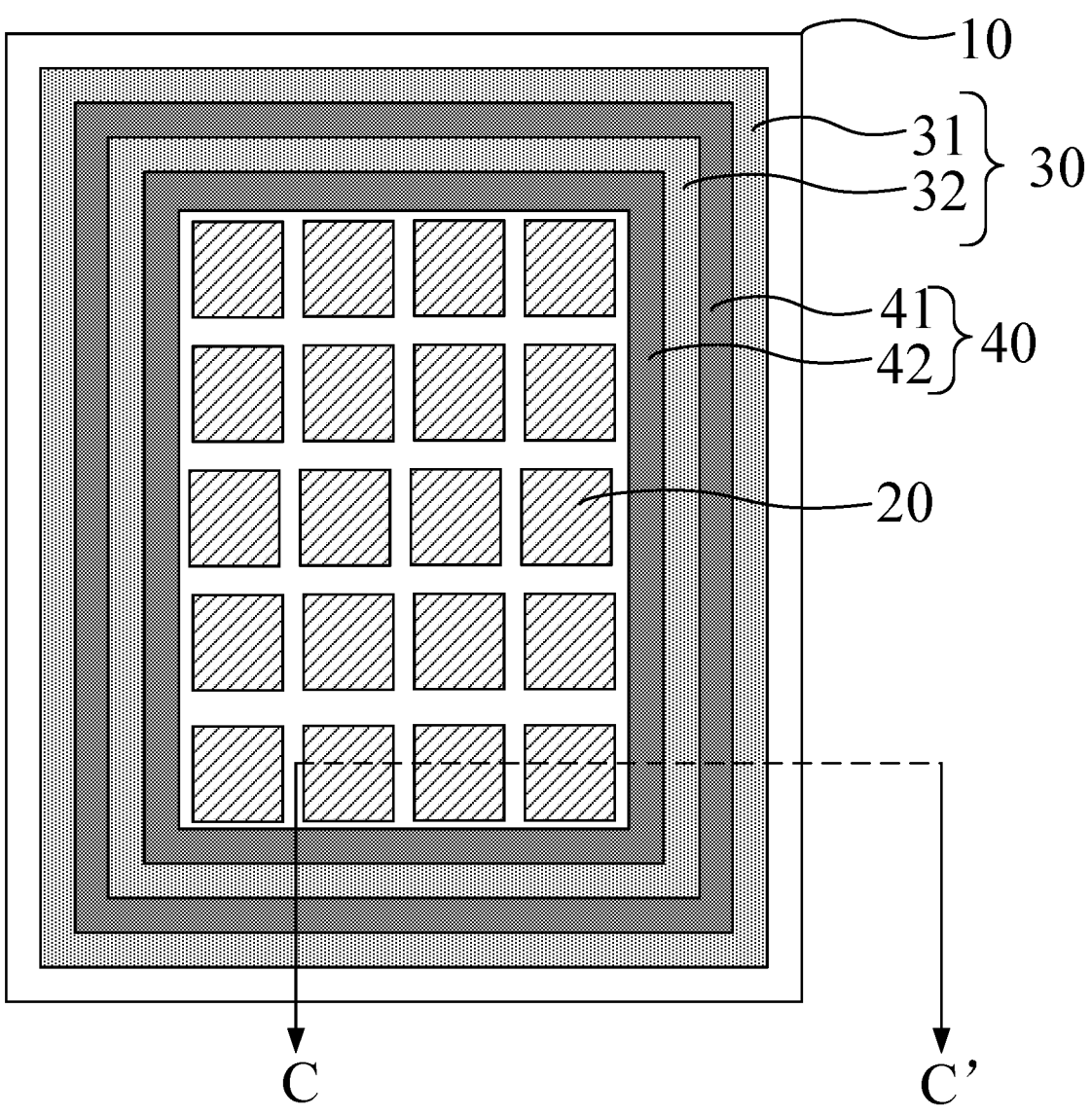
FIG. 3 is a diagram illustrating the structure of another display panel according to an embodiment of the present application.
Figure 4:
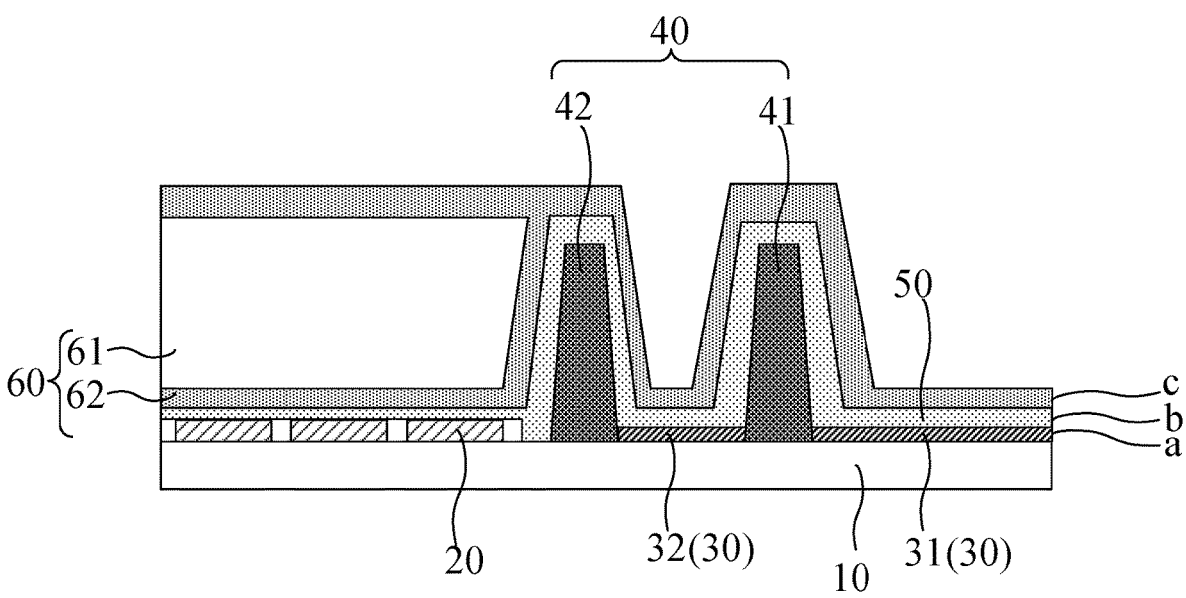
FIG. 4 is a section view of the display panel of FIG. 3 along section line CC'.

Referring to FIGS. 3 and 4, the barricade 40 includes at least two sub-barricades. Each sub-barricade surrounds the light-emitting structures 20. The obstruction layer 30 further includes a second obstruction layer 32 disposed between two adjacent sub-barricades 41 and 42.

Since no wire exists between two adjacent sub-barricades, with the arrangement in which the second obstruction layer 32 is disposed between the two adjacent sub-barricades, the thickness of the isolation layer 50 corresponding to the second obstruction layer 32 is reduced. The isolation layer 50 can partially further reduce the diffusion rate of vapor and oxygen and prevent vapor and oxygen from invading. Moreover, the second obstruction layer 32 can further react with vapor and oxygen that enter the display panel to form the dense metal-oxide thin film so that vapor and oxygen can be further prevented, thereby further improving the reliability of the display panel.

Two sub-barricades or more than two sub-barricades may be provided. This is not limited in this embodiment. FIGS. 3 and 4 illustrate that the barricade 40 includes two sub-barricades, that is, a first sub-barricade 41 and a second sub-barricade 42. The second obstruction layer 32 is disposed between the first sub-barricade 41 and the second sub-barricade 42. This is not to limit the present application. In other embodiments, three or more sub-barricades may be disposed according to needs, and the second obstruction layer 32 may be disposed between any two sub-barricades.

Additionally, as shown in FIG. 4, the obstruction layer 30 includes a first side face adjacent to the edge of the display panel, the isolation layer 50 includes a second side face b adjacent to the edge of the display panel, the encapsulation layer 60 includes a third side face c adjacent to the edge of the display panel, and the first side face a, the second side face b and the third side face c may be located on the same plane. During the manufacturing process, the isolation layer 50 and the inorganic layer 62 may use the same mask, reducing the process cost. Moreover, the first side face a of the obstruction layer 30 and the second side face b of the isolation layer 50 are located on the same plane, and during the process of forming the isolation layer 50, the early-formed metal-oxide layer may thin the isolation layer 50 adjacent to the edge of the display panel so that the thickness of the edge of the isolation layer 50 is thinner. When vapor and oxygen invade the interior of the display panel via the isolation layer 50, due to the thinner thickness of the isolation layer 50 of the edge of the display panel, the diffusion rate of vapor and oxygen can be minimized, preventing vapor and oxygen from eroding the light-emitting structures 20.

Figure 5:
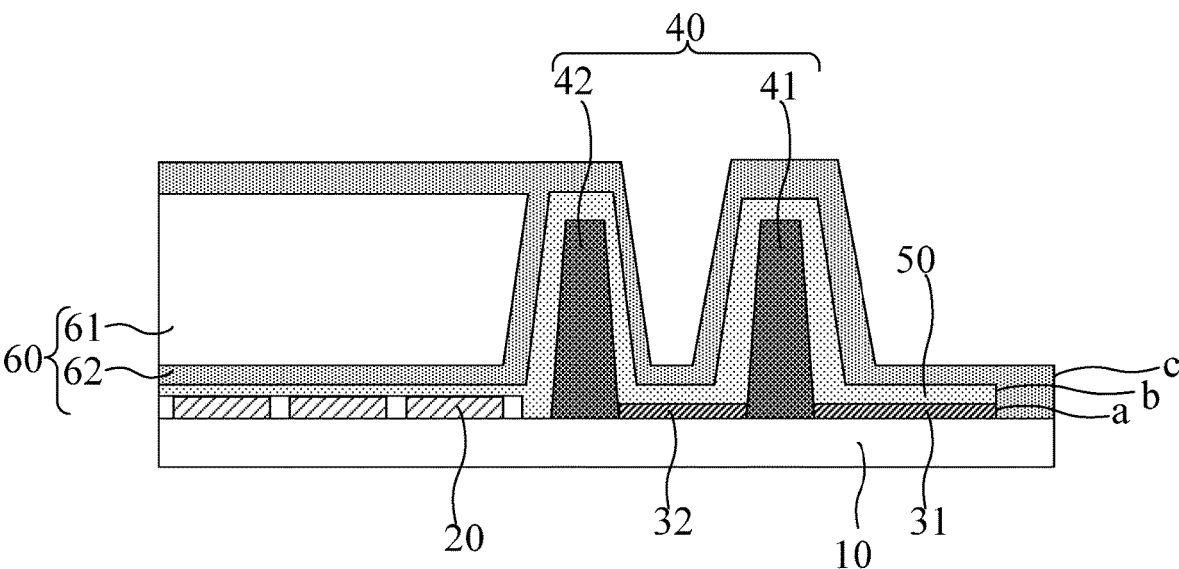
FIG. 5 is another section view of the display panel of FIG. 3 along section line CC'.

Referring to FIG. 5, the third side face c of the encapsulation layer 60 may be located on a side of the first side face a away from the multiple light-emitting structures 20, that is, the encapsulation layer 60 covers the obstruction layer 30 and encloses the first side face a of the obstruction layer 30 adjacent to the edge of the display panel. The inorganic layer 62 in the encapsulation layer 60 has a better vapor and oxygen blocking performance. The encapsulation layer 60 is configured to completely cover the first side face a of the obstruction layer 30 adjacent to the edge of the display panel so that vapor and oxygen can be better prevented from entering the light-emitting structures 20 from the edge of the display panel, further improving the reliability of the display panel.

In an embodiment, the third side face c of the encapsulation layer 60 may be located on a side of the second side face b away from the light-emitting structures 20, that is, the encapsulation layer 60 covers the isolation layer 50 and encloses the second side face b of the isolation layer 50 adjacent to the edge of the display panel.

The inorganic layer 62 in the encapsulation layer 60 has a better vapor and oxygen blocking performance. The encapsulation layer 60 is configured to completely cover the second side face b of the isolation layer 50 adjacent to the edge of the display panel so that vapor and oxygen can be better prevented from entering the light-emitting structures 20 from the edge of the display panel, further improving the reliability of the display panel. In an embodiment, along the direction parallel to the surface of the substrate 10, the distance between the third side face c of the encapsulation layer 60 adjacent to the edge of the display panel and the first side face a is greater than 30 micrometers.

When the distance between the third side face c of the encapsulation layer 60 and the first side face a of the obstruction layer 30 is smaller, the first side face a may not be completely clad by the encapsulation layer 60 due to a manufacturing process deviation. The distance between the first side face a and the third side face c is configured to be greater than 30 micrometers, ensuring that the encapsulation layer 60 can better seal the obstruction layer 30 and that the display panel can have a better vapor and oxygen blocking performance.

In an embodiment, along the direction parallel to the surface of the substrate 10, the distance between the third side face c of the encapsulation layer 60 adjacent to the edge of the display panel and the second side face b is greater than 30 micrometers.

When the distance between the third side face c of the encapsulation layer 60 and the second side face b of the isolation layer 50 is smaller, the second side face b may not be completely clad by the encapsulation layer 60 due to a manufacturing process deviation. The distance between the second side face b and the third side face c is configured to be greater than 30 micrometers, ensuring that the encapsulation layer 60 can better clad the isolation layer 50 and that the display panel can have a better vapor and oxygen blocking performance.

Referring to FIG. 6, in an embodiment, the first side face a is located on a side of the second side face b away from the multiple light-emitting structures 20. Along the direction parallel to the surface of the substrate 10, the distance between the first side face a and the second side face b ranges from 30 micrometers to 50 micrometers.

The first side face a is located on a side of the second side face b away from the light-emitting structures 20, and during the process of forming the isolation layer 50, the early-formed metal-oxide layer may thin the edge of the isolation layer 50 so that the thickness of the edge adjacent to the isolation layer 50 is thinner. When vapor and oxygen invade the interior of the display panel via the isolation layer 50, due to the thinner thickness of the isolation layer 50 of the edge of the panel, the diffusion rate of vapor and oxygen can be minimized, preventing vapor and oxygen from eroding the multiple light-emitting structures 20.

Additionally, when the distance between the first side face a of the obstruction layer 30 and the second side face b of the isolation layer 50 is smaller, due to a manufacturing process deviation, the early-formed metal-oxide layer cannot thin the thickness of the edge of the isolation layer so that the vapor and oxygen blocking performance is affected. The too large distance between the first side face a and the second side face b is not conducive to a reduction in the size of the bezel of the display panel. The distance between the first side face a and the second side face b is configured to range from 30 micrometers and 50 micrometers so that when the early-formed metal-oxide layer reduces the thickness of the edge of the isolation layer 50, the display panel can be ensured to have a smaller bezel.

The preceding embodiments illustrate the position of the obstruction layer 30. The material and thickness of the metal-oxide layer are illustrated below.

The material selection of the metal-oxide layer mainly considers the following aspects. Firstly, it can be reduced by the reducing gas used in the process of forming the isolation layer 50 to reduce the thickness of the isolation layer 50 to the target thickness. Secondly, the metal reduced by the reducing gas can react with vapor and oxygen to form the metal-oxide thin film to prevent vapor and oxygen. Any material satisfying the preceding two aspects is suitable for the metal-oxide layer of this embodiment.

In an embodiment, the metal in the obstruction layer 30 includes at least one of magnesium, aluminum, manganese, zinc, chromium, iron, cobalt, nickel, tin and lead. That is, the metal-oxide layer may include at least one of magnesium oxide, aluminum oxide, manganese oxide, zinc oxide, chromium oxide, iron oxide, cobalt oxide, nickel oxide, tin oxide and lead oxide.

All the preceding metal oxides may react with the reducing gas used in the process of forming the isolation layer 50, and as a sacrificial agent, the reduced metal reacts with the invaded vapor and oxygen to prevent vapor and oxygen from invading. Moreover, the preceding metal materials have lower costs and quite mature manufacturing processes. The use of the preceding metal may reduce the manufacturing cost of the display panel.

In the present application, the reducing gas used in the process of forming the isolation layer 50 is hydrogen that does not affect the encapsulation effect in the manufacturing process of the display panel of the present application. Certainly, in other embodiments, the reducing gas may also use carbon monoxide, methane and other reducing gases.

In an embodiment, the metal in the obstruction layer 30 includes aluminum and magnesium. Aluminum and magnesium can react with vapor and oxygen to form aluminum oxide and magnesium oxide that are more compact than other metal-oxide thin films, better preventing vapor and oxygen from invading.

Additionally, the obstruction layer 30 using aluminum has the following advantages: since the plurality of layers of metal wires in the display panel are mostly made of aluminum that is easily oxidized by oxygen in the air to form oxides, when the metal wires in the display panel are manufactured, an aluminum layer surrounding the light-emitting structures 20 is formed in the non-display region at the same time. The aluminum layer is oxidized by air to form an aluminum-oxide layer without using additional processes, which saves the process cost.

In an embodiment, the thickness of the obstruction layer 30 ranges from 10 nanometers to 150 nanometers.

The thickness of the obstruction layer 30 is equal to the thickness of the metal-oxide layer. Too large thickness of the metal-oxide layer leads to the too large thickness of the display panel. Too small thickness of the metal-oxide layer cannot effectively lower the formation rate of the isolation layer 50 so that the thickness of the isolation layer 50 cannot be reduced to the target thickness, for example, to 10 nanometers (the target thickness is 10 nanometers). Too large thickness of the metal-oxide layer is not conducive to a reduction in the thickness of the display panel. The thickness of the metal-oxide layer is configured to range from 10 nanometers to 150 nanometers so that when the thickness of the isolation layer 50 can be well thinned, the display panel can be ensured to have a smaller thickness at the same time. In the practical manufacturing process, the thickness of the metal-oxide layer may be disposed according to the target thickness of the isolation layer 50. This is not limited in this embodiment of the present application.

In an embodiment, the isolation layer 50 includes silicon oxide. The thickness of the isolation layer 50 covering the obstruction layer 30 is less than or equal to 10 nanometers. The thickness of the isolation layer 50 not covering the obstruction layer 30 ranges from 20 nanometers to 200 nanometers.

The smaller thickness of silicon oxide is, the better the vapor and oxygen blocking performance of silicon oxide is. Therefore, the thickness of the isolation layer 50 covering the obstruction layer 30 is less than or equal to 10 nanometers so that the better vapor and oxygen blocking performance of the display panel can be ensured.

When the thickness of the isolation layer 50 is too small, the manufacturing process is too difficult, which is not conducive to a reduction in the process cost. When the thickness of the isolation layer 50 is too large, the thickness of the display panel is not easily thinned, and a quite ideal thickness cannot be achieved when the isolation layer 50 is thinned via a metal oxide. The thickness of the isolation layer 50 not covering the obstruction layer 30 is configured to range from 20 nanometers to 200 nanometers so that when the manufacturing process is ensured to be less difficult, the metal-oxide layer can be ensured to thin the isolation layer 50 to a quite ideal thickness, the vapor and oxygen blocking performance can be ensured, and the smaller thickness of the display panel can be ensured at the same time.

Embodiments of the present application further provide a manufacturing method for a display panel that can be applied to manufacturing the display panel in the preceding technical solutions. FIG. 7 is a flowchart of a manufacturing method for a display panel according to an embodiment of the present application. As shown in FIG. 7, the manufacturing method for a display panel includes the steps below.

In S10, providing a substrate, the light-emitting structures are disposed on the substrate, and a metal-oxide layer is disposed around the multiple light-emitting structures.

In S20, a reducing gas is introduced to form an isolation layer such that the isolation layer covers the light-emitting structures.

In S30, an obstruction layer is formed by a reduction reaction between the metal-oxide layer and the reducing gas used in the process of forming the isolation layer such that at least part of the isolation layer covers the obstruction layer and such that a thickness of a part of the isolation layer covering the obstruction layer is less than a thickness of the other part of the isolation layer without covering the obstruction layer.

In S20, the reducing gas introduced to form the isolation layer is the preceding hydrogen.

In the process of forming the isolation layer, for example, in the process of forming the silicon-oxide layer by use of the chemical vapor deposition process, hydrogen in the deposition chamber can undergo a reduction reaction with the metal-oxide layer, for example, a reduction reaction with an aluminum-oxide layer, reducing the film formation rate of the isolation layer covering the surface of the metal-oxide layer, so that the thickness of the part of the isolation layer covering the metal-oxide layer is less than the thickness of the other part of the isolation layer without covering the obstruction layer. The diffusion rate of vapor and oxygen in the isolation layer having a smaller thickness is significantly lower than the diffusion rate of vapor and oxygen in the isolation layer having a larger thickness so that the reduction in the thickness of the isolation layer greatly prevents most vapor and oxygen from invading, protects the light-emitting structures, ensures the reliability of the display panel and solves the problem of a reliability failure in the display panel from the edge to the inside. Moreover, since the metal-oxide layer is configured to surround the light-emitting structures, the problem of a reliability failure in the whole display panel from the edge to the inside is solved, and the reliability of the whole display panel is improved.

In S40, an encapsulation layer is formed such that the encapsulation layer covers the isolation layer and the obstruction layer.

The method for the display panel according to this embodiment of the present application can be referred to the display panel according to any embodiment of the present application and has the same effects as the display panel according to any embodiment of the present application. The repetitive content is not described here.

What is claimed is:

1. A display panel, comprising:
a substrate;
a plurality of light-emitting structures disposed on the substrate;
an obstruction layer disposed on the substrate and configured to prevent oxygen and vapor entering the display panel, the obstruction layer surrounding the plurality of light-emitting structures;
an isolation layer disposed on the substrate and covering the plurality of light-emitting structures, wherein a first part of the isolation layer covers the obstruction layer; and
an encapsulation layer disposed on the substrate and covering the isolation layer and the obstruction layer, wherein a thickness of the first part of the isolation layer covering the obstruction layer is less than a thickness of a second part of the isolation layer that does not cover the obstruction layer, the isolation layer comprises silicon oxide, the thickness of the first part of the isolation layer is less than or equal to 10 nanometers, and the thickness of the second part of the isolation layer ranges from 20 nanometers to 200 nanometers.

2. The display panel according to claim 1, further comprising
a barricade disposed on the substrate, wherein the barricade surrounds the plurality of light-emitting structures, the obstruction layer comprises a first obstruction layer, and the first obstruction layer is disposed on a side of the barricade away from the plurality of light-emitting structures.

3. The display panel according to claim 2, wherein the barricade comprises at least two sub-barricades, and each of the at least two sub-barricades surrounds the plurality of light-emitting structures; and the obstruction layer further comprises a second obstruction layer, and the second obstruction layer is disposed between adjacent two of the at least two sub-barricades.

4. The display panel according to claim 3, wherein the barricade comprises a first sub-barricade that is adjacent to a second sub-barricade and the second obstruction layer is disposed between the first sub-barricade and the second sub-barricade.

5. The display panel according to claim 2, wherein the obstruction layer comprises a first side face adjacent to an edge of the display panel, the isolation layer comprises a second side face adjacent to the edge of the display panel, the first side face is located on a side of the second side face away from the plurality of light-emitting structures, and along a direction parallel to a surface of the substrate, a distance between the first side face and the second side face ranges from 30 micrometers to 50 micrometers.

6. The display panel according to claim 2, wherein the encapsulation layer comprises an organic layer and an inorganic layer, and the barricade is covered by the inorganic layer in the encapsulation layer.

7. The display panel according to claim 1, wherein the encapsulation layer covers the obstruction layer and encloses a first side face of the obstruction layer adjacent to an edge of the display panel.

8. The display panel according to claim 7, wherein along a direction parallel to a surface of the substrate, a distance between a third side face of the encapsulation layer and the first side face is greater than 30 micrometers, wherein the third side face of the encapsulation layer is adjacent to the edge of the display panel.

9. The display panel according to claim 1, wherein the encapsulation layer covers the isolation layer and encloses a second side face of the isolation layer adjacent to an edge of the display panel.

10. The display panel according to claim 9, wherein along a direction parallel to a surface of the substrate, a distance between a third side face of the encapsulation layer and the second side face is greater than 30 micrometers, wherein the third side face of the encapsulation layer is adjacent to the edge of the display panel.

11. The display panel according to claim 1, wherein the substrate comprises a display region and a non-display region, the plurality of light-emitting structures are located in the display region of the substrate; and the obstruction layer is located in the non-display region of the display panel and surrounds the plurality of light-emitting structures.

12. The display panel according to claim 11, wherein the encapsulation layer comprises an organic layer and an inorganic layer, the isolation layer and the inorganic layer use a same mask.

13. The display panel according to claim 12, wherein the inorganic layer comprises silicon oxynitride or silicon nitride.

14. The display panel according to claim 1, wherein the obstruction layer comprises a first side face adjacent to an edge of the display panel, the isolation layer comprises a second side face adjacent to the edge of the display panel, the encapsulation layer comprises a third side face adjacent to the edge of the display panel, and the first side face, the second side face and the third side face are located on a same plane.

15. The display panel according to claim 1, wherein metal in the obstruction layer comprises aluminum and magnesium.

16. The display panel according to claim 1, wherein a thickness of the obstruction layer ranges from 10 nanometers to 150 nanometers.

17. The display panel according to claim 1, wherein the obstruction layer is located in a non-display region of the display panel and is arranged continuously along a periphery of a display region.

18. A manufacturing method for the display panel according to claim 1, comprising:
   providing the substrate;
   disposing the plurality of light-emitting structures on the substrate;
   forming the isolation layer such that the isolation layer covers the plurality of light-emitting structures;
   forming the obstruction layer such that at least part of the isolation layer covers the obstruction layer; and
   forming the encapsulation layer such that the encapsulation layer covers the isolation layer and the obstruction layer.

19. The manufacturing method for the display panel according to claim 18, wherein the reducing gas in the step of introducing the reducing gas to form the isolation layer is hydrogen.

* * * * *